(12) United States Patent
Edo

(10) Patent No.: US 7,276,097 B2
(45) Date of Patent: Oct. 2, 2007

(54) LOAD-LOCK SYSTEM, EXPOSURE PROCESSING SYSTEM, AND DEVICE MANUFACTURING METHOD

(75) Inventor: Ryo Edo, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 421 days.

(21) Appl. No.: 10/809,021

(22) Filed: Mar. 24, 2004

(65) Prior Publication Data
US 2004/0187452 A1  Sep. 30, 2004

(30) Foreign Application Priority Data
Mar. 25, 2003 (JP) .............................. 2003-081733
Mar. 10, 2004 (JP) .............................. 2004-067778

(51) Int. Cl.
*B05C 5/00* (2006.01)

(52) U.S. Cl. ..................... 55/385.2; 55/385.6; 96/125; 454/57; 454/187; 156/345.31; 156/345.32; 118/52; 118/66; 118/719; 118/725; 438/716

(58) Field of Classification Search .............. 55/385.2, 55/385.6; 454/57, 187; 118/66, 719, 725, 118/52; 156/345.31, 345.32; 438/716; 96/125
See application file for complete search history.

(56) References Cited
U.S. PATENT DOCUMENTS
5,725,664 A * 3/1998 Nanbu et al. .................. 118/52
5,914,493 A * 6/1999 Morita et al. ............. 250/492.2
5,943,230 A    8/1999 Rinnen et al.
6,199,388 B1 * 3/2001 Fischer, Jr. ..................... 62/90
6,448,537 B1 * 9/2002 Nering ........................ 219/390
6,805,748 B1 * 10/2004 Edo ............................. 118/719
6,828,235 B2 * 12/2004 Takano ........................ 438/680
2003/0015290 A1 * 1/2003 Edo ....................... 156/345.27
2003/0021671 A1   1/2003 Edo FOREIGN PATENT DOCUMENTS
JP           4-277025      2/1992
JP        2001-118904 A    4/2001
JP        2003-031639 A    1/2003
JP         2003-45947 A    2/2003

OTHER PUBLICATIONS
U.S. Appl. No. 09/691,068, filed Mar. 19, 2004, Edo.

* cited by examiner

*Primary Examiner*—Matthew Savage
*Assistant Examiner*—Minh-Chau T. Pham
(74) *Attorney, Agent, or Firm*—Morgan & Finnegan, LLP

(57) ABSTRACT

A load-lock system includes a load-lock chamber arranged between a storage port which stores a substrate and a process chamber which processes the substrate in a process space maintained at a pressure lower than that in the storage port, and a dehumidifying unit which forms a dehumidified environment in the load-lock chamber. A system preferably includes another chamber between said storage port and said load-lock chamber, wherein said dehumidifying unit dehumidifies said another chamber.

14 Claims, 6 Drawing Sheets

LOAD-LOCK SYSTEM, EXPOSURE PROCESSING SYSTEM, AND DEVICE MANUFACTURING METHOD

FIELD OF THE INVENTION

The present invention relates to a load-lock system in which, for example, a dehumidified environment is formed inside when a substrate to be processed such as a semiconductor substrate, liquid crystal substrate, or the like is to be transported from a port serving as a supplying portion to a process chamber for performing exposure processing or the like in a process of manufacturing the semiconductor substrate or liquid crystal display substrate, an exposure processing system, and a device manufacturing method.

BACKGROUND OF THE INVENTION

A recent increase in performance and prevalence of electronic products is increasingly demanding efficient manufacture of a semiconductor device for these electronic products with an increase in integration scale (i.e., further miniaturization). For example, in a semiconductor exposure apparatus which transfers a circuit pattern onto a silicon wafer, the wavelength of exposure light has been shortened for micropatterning. More specifically, the exposure light has been changed to the KrF laser beam, ArF laser beam, $F_2$ laser beam, soft X-ray radiated from an SR ring, and the like.

The exposure light with a short wavelength such as the $F_2$ laser beam, and soft X-ray is greatly attenuated in the outer air. Thus, there is proposed a method of accommodating the exposure unit of an exposure apparatus in a chamber, and setting the interior of the chamber to an $N_2$ atmosphere or reduced-pressure He atmosphere in which exposure light is less attenuated. In an electron beam exposure apparatus or the like, a vacuum atmosphere is formed. In a processing apparatus such as a CVD apparatus, an atmosphere different from the outer air or a vacuum atmosphere is formed, when a process gas different from the outer air is used or to prevent an organic substance or moisture from attaching to a substrate.

A conventional processing system typically comprises a load-lock chamber whose atmosphere can be switched between, for example, an atmospheric pressure environment and a reduced-pressure environment in transferring a substrate to be processed such as a semiconductor substrate, liquid crystal display substrate, or the like between a port serving as a supply portion and a process chamber which performs exposure processing or the like. The load-lock chamber has gate valves which connect to the port and process chamber, respectively. In the transfer of the substrate to be processed between the port and the load-lock chamber, the gate valve between the load-lock chamber and the process chamber is closed, and gas is supplied to the load-lock chamber or the load-lock chamber is opened to the outer air, thereby maintaining the pressure in the load-lock chamber at the atmospheric pressure. In the transfer of the substrate to be processed between the load-lock chamber and the process chamber, the gate valve between the load-lock chamber and the port is closed, and the load-lock chamber is evacuated to a vacuum, thereby maintaining the interior of the load-lock chamber in a vacuum or reduced pressure environment.

In general, when the pressure of gas abruptly drops, the temperature abruptly drops due to adiabatic expansion. In a conventional arrangement, evacuation of a load-lock chamber causes adiabatic expansion in the load-lock chamber, thus cooling the gas in the load-lock chamber. In the load-lock chamber, heat transfer from the walls of the load-lock chamber to the gas occurs in addition to the adiabatic expansion. An actual drop in gas temperature changes depending on the time required for gas exhaust. Generally, a temperature drop increases with an increasing gas exhaust rate.

For this reason, a conventional processing system cannot perform high-quality processing for a substrate to be processed while ensuring a predetermined throughput. The time required to evacuate a load-lock chamber affects not only the number of substrates to be processed that are supplied to a process chamber via the load-lock chamber per unit time but also the throughput of the processing system. Accordingly, the gas exhaust time is preferably short for the load-lock chamber. This is demanded particularly in a processing system such as an exposure apparatus which requires a high throughput.

However, a short gas exhaust time causes an abrupt drop in temperature of the atmosphere in the load-lock chamber. In, for example, a processing system which performs high-speed processing at a throughput of about 60 to 100 W/h, each load-lock chamber needs to be evacuated in several ten seconds for each wafer even if a plurality of load-lock chambers are provided. The volume of each load-lock chamber is preferably minimized in order to shorten the gas exhaust time. For example, the volume is usually designed to be 3 to 10 liters for a wafer having a diameter of 300 mm. When a load-lock chamber having a volume of 3 to 10 liters is evacuated in several ten seconds, the gas temperature drops by several ten degrees due to adiabatic expansion. According to experiments by the present inventor, when a load-lock having a volume of 8 liters and a room temperature of 23° C. is evacuated from the atmospheric pressure to 100 Pa, the temperature dropped to −25° C.

An abrupt drop in temperature in the atmosphere in the load-lock chamber causes condensation, and moisture condenses around fine particles, $SO_2$, or the like in the gas. In the process of the condensation, moisture takes in fine particles present in the ambient space to form a large agglomeration of particles and moisture. Particles blown up by a flow of exhaust gas drop in an agglomerate state onto a substrate as the pressure of the exhaust gas decreases. The particles may contaminate the substrate or the moisture may attach to the substrate. It takes a long time to remove the adsorbed moisture, and a high throughput cannot be ensured. In addition, an oxide film may naturally grow on the surface of the moisture or a contaminant may dissolve in it, and thus, high-quality processing cannot be performed.

SUMMARY OF THE INVENTION

Under the above-mentioned circumstances, the present invention has as its object to provide a load-lock system which implements high-quality processing while ensuring a predetermined throughput, an exposure processing system, and a device manufacturing method.

According to the first aspect of the present invention, a load-lock system comprising a load-lock chamber arranged between a storage port which stores a substrate and a process chamber which processes the substrate in a process space maintained at a pressure lower than a pressure in the storage port, and a dehumidifying unit which forms a dehumidified environment in the load-lock chamber is provided.

According to the second aspect of the present invention, an exposure processing system comprising a storage port which stores a substrate and an exposure processing unit which exposures the substrate in a process space maintained at a pressure lower than a pressure in the outside and a load-lock chamber arranged between the storage port and the exposure processing unit, and a dehumidifying unit which forms a dehumidified environment in the load-lock chamber is provided.

According to the third aspect of the present invention, a device manufacturing method comprising an exposure step of exposing the substrate using the above-mentioned exposure processing system, and a development step of developing the exposed substrate is provided.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explaining the principles of the invention.

DETAILED DESCRIPTION OF THE PREFERRED EMBODIMENTS

Figure 1:
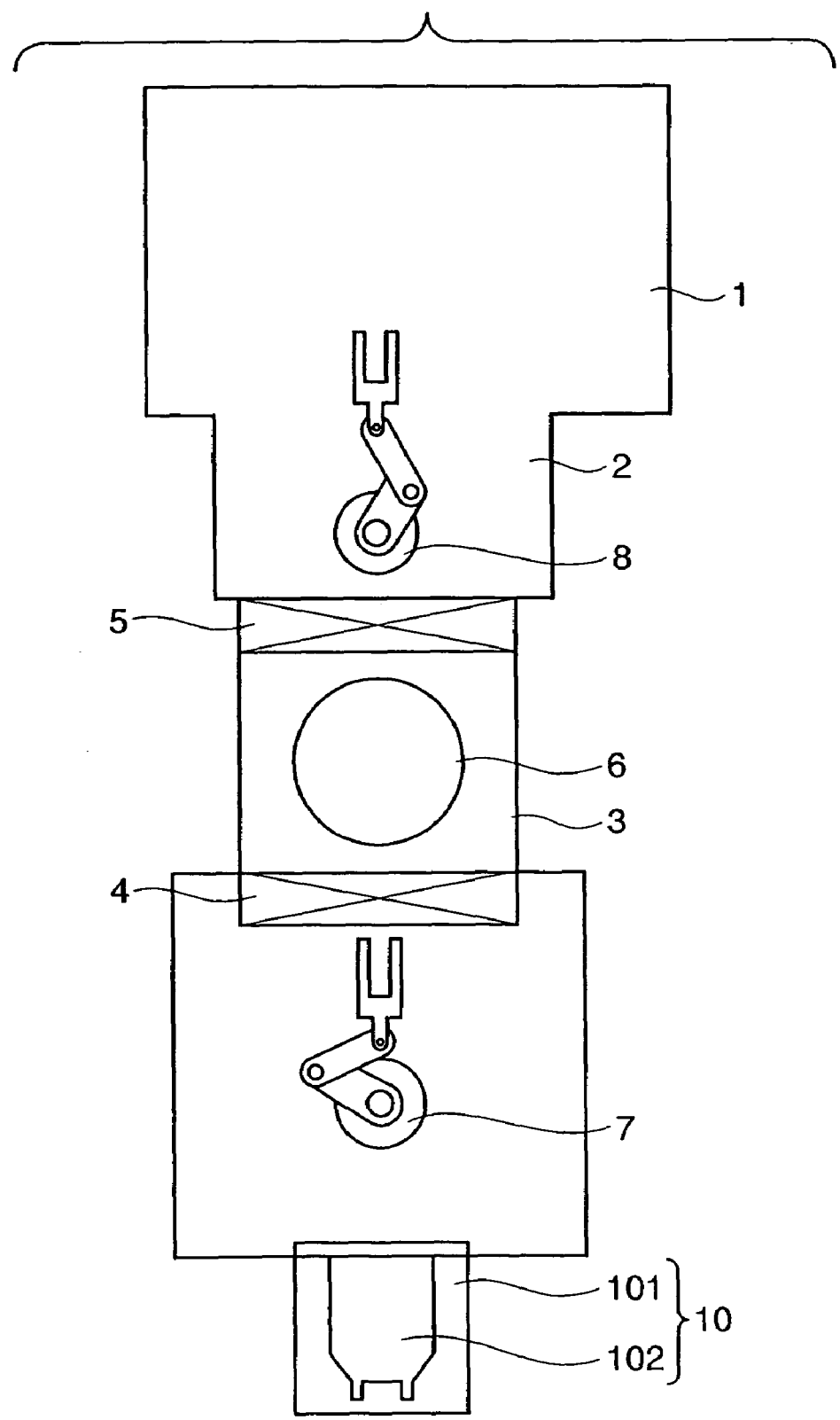
FIG. 1 is a schematic block diagram of a load-lock system according to a preferred embodiment of the present invention.
Figure 2:
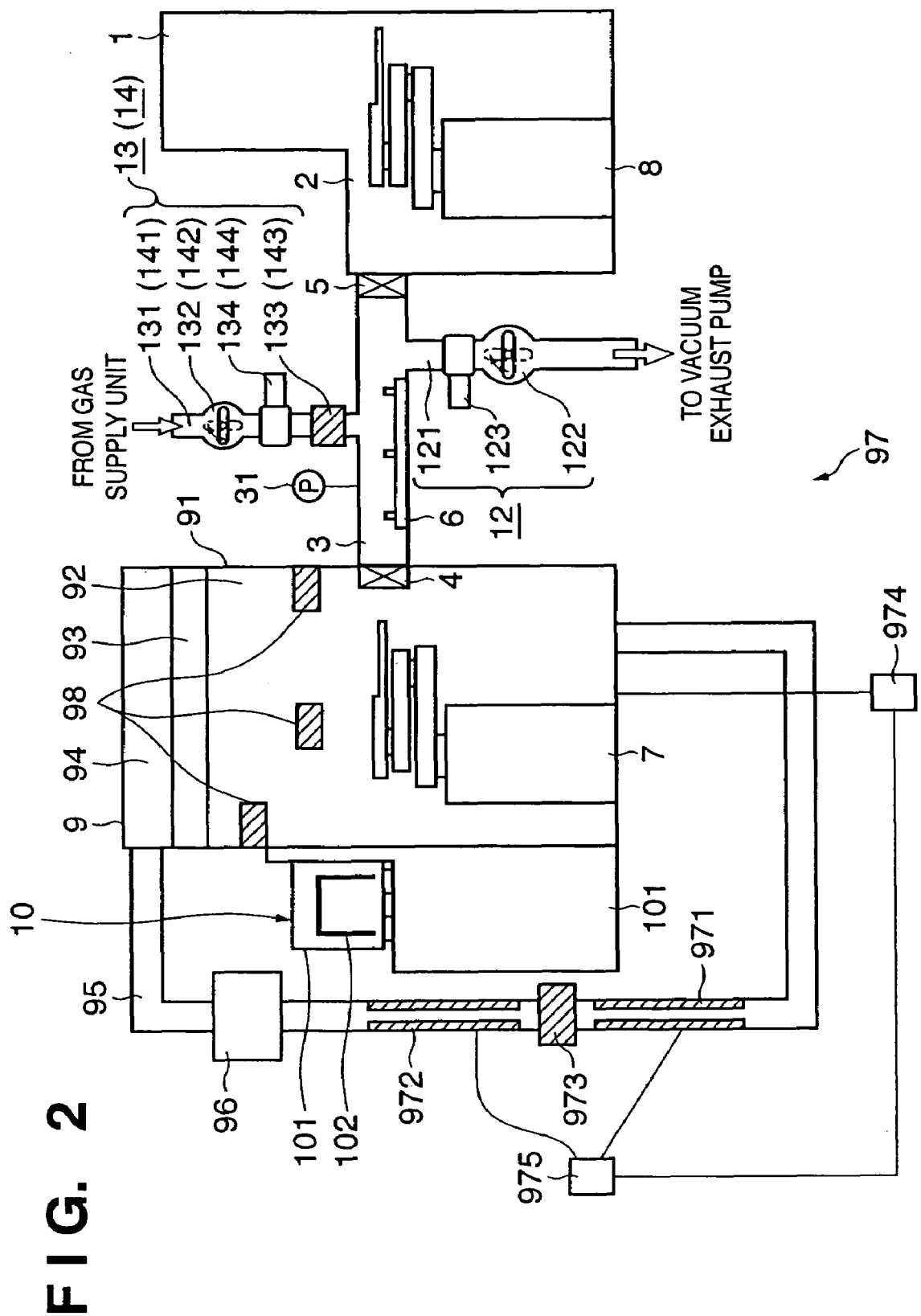
FIG. 2 is a detailed block diagram of the load-lock system shown in FIG. 1.

A load-lock system according to a preferred embodiment of the present invention will be described below with reference to the accompanying drawings. FIG. 1 is a block diagram schematically showing the load-lock system according to the preferred embodiment of the present invention. FIG. 2 is a block diagram showing the detailed arrangement of the load-lock system. The load-lock system of this embodiment performs exposure processing for a wafer serving as a base to be processed. In the present invention, however, processes by the load-lock system are not limited to exposure. The present invention is suitably applied to exposure processing which requires a high throughput, as described above.

The load-lock system has a process chamber 1, preliminary space 2, load-lock chamber 3, gate valves 4 and 5, substrate chuck (substrate holding chuck) 6, transport portions 7 and 8, and storage port 10.

The process chamber 1 is kept in a reduced-pressure He atmosphere which incorporates an exposure processing unit (or process station) for a substrate to be processed (not shown). According to the present invention, the process chamber 1 generally only needs to be kept in a vacuum or reduced-pressure environment. The preliminary space 2 is arranged in the process chamber 1 and comprises the transport portion 8 for loading/unloading a substrate to be processed to/from the exposure processing unit of the chamber 1.

A transport hand of the transport portion 8 is so formed as to minimize its contact area with the substrate. For example, one or a plurality of pins are provided on the transport hand to support the lower surface of the substrate to be processed. Opposing claw-like or wall-like members are also provided at appropriate intervals at the circumference of the substrate so as to prevent any misalignment of the substrate in the transport hand during transport. Each claw or wall may be arranged to have a pin-like projection so as to minimize its contact area with the substrate. Alternatively, three or more conical pins may be provided such that the side slope portion of each pin abuts against a circumference of the substrate and the remaining portion does not come into contact with the substrate.

The load-lock chamber 3 has a function of setting its interior to an atmospheric-pressure atmosphere by opening the chamber 3 to the outer air or supplying gas into the chamber 3 and a function of setting it to a reduced-pressure or vacuum environment atmosphere by using, e.g., a vacuum pump. The load-lock chamber 3 comprises the substrate holding chuck 6, which is arranged to accommodate one or a plurality of substrates. The substrate holding chuck 6 has three pins for holding a wafer.

The transport portions 7 and 8 are arranged to transport each substrate. The internal volume of the load-lock chamber 3 desirably has a minimum size so as to minimize a gas exhaust time. In this embodiment, a case will be illustrated wherein a wafer has a diameter of 300 mm$\phi$, the gate valves 4 and 5 each have an opening height of 50 mm, and the load-lock chamber 3 has an internal volume of 8 liters (i.e., 400 mm×400 mm×50 mm). However, the present invention is not limited to this.

The load-lock chamber 3 receives a substrate to be processed before the process from storage port 10 and supplied to the process chamber 1. The load-lock chamber 3 is connected on the outer air side to the gate valve 4 for cutting off the load-lock chamber 3 from the storage port 10 in the outer air and on the process chamber 1 side to the gate valve 5 for cutting off the load-lock chamber 3 from the preliminary space 2.

As shown in FIG. 2, an exhaust portion 12 which evacuates the load-lock chamber 3, an He gas supply portion 13 which supplies He gas, and an $N_2$ gas supply portion 14 (not shown) which supplies $N_2$ gas are provided in the load-lock chamber 3.

A pressure gauge 31 which measures the pressure in the load-lock chamber 3 is also provided in the load-lock chamber 3. The pressure gauge 31 is connected to a controller (not shown). A controller 975 (to be described later) may also serve as the pressure gauge controller. The controller controls opening/closing of valves 132 and 142 on the basis of a detection result from the pressure gauge 31. The controller also controls opening/closing of the gate valves 4 and 5 on the basis of the opening/closing of the valves 132 and 142. A detection unit (not shown) may be provided to detect the opening/closing of the gate valves 4 and 5, and the controller may control operation of the transport portions 7 and 8 on the basis of a detection result from the detection unit.

The exhaust portion 12 comprises a vacuum exhaust pump (not shown) and also comprises a vacuum exhaust pipe 121 which connects the pump and the load-lock chamber 3, a valve 122 which controls gas exhaust, and a flowmeter 123 which measures the flow rate of gas flowing in the exhaust pipe 121.

The gas supply means 13 and 14 each have a similar arrangement. The gas supply means 13 and 14 have supply pipes 131 and 141 which connect a gas supply unit (not shown) and the load-lock chamber 3, and valves 132 and 142 which control gas supply, respectively. A gas supply flowmeter 134 (144) is provided between the valve 132 (142) and the process chamber 1. Gas supplied from the gas supply unit passes through the valves 132 and 142 and then through the gas supply flowmeters 134 and 144. When the gas passes through filters 133 and 143, the particles are removed, and the gas is purified and supplied to the load-lock chamber 3.

The storage port 10 accommodates one or a plurality of substrates to be processed and is maintained at the atmospheric pressure. In this embodiment, the storage port 10 functions as a substrate supply unit and substrate collection unit, that is, a unit for accommodating a substrate before process and a substrate after process. The storage port 10, however, may function as a unit for accommodating either a substrate before process or a substrate after process. The storage port 10 comprises a substrate carrier table 101, on which a carrier 102 storing a substrate is placed. The transport portion 7 is disposed in a mini-environment 9 to transport a substrate between the carrier 102 on the substrate carrier table 101 and the load-lock chamber 3.

The transport portions 7 and 8 each has an arm which can rotate and translate, and can support a substrate to be processed. Any known technique such as a transport robot generally used in a cluster tool can be used as each of the transport portions 7 and 8, and a detailed description thereof will be omitted.

Generally, a load-lock system including the load-lock chamber 3 is placed in a clean room. If the load-lock chamber 3 is opened to the atmosphere in the clean room, the gas in the load-lock chamber 3 and that in the surrounding clean room scatter and mix well. The gas in the clean room is obtained by performing particle and humidity control for the outer air. The humidity is often set to about 50% to cope with a problem such as generation of static electricity. Hence, even if dry gas is supplied while the load-lock chamber 3 is opened to the outer air, the humidity of the load-lock chamber 3 increases as far as the load-lock chamber 3 is opened to the clean room.

For example, assume that the load-lock chamber 3 has a volume of 6 liters and that it is opened to the clean room while being purged with completely dry gas having a humidity of 0%. In this case, the average humidity in the load-lock chamber 3 becomes 6% in about 5 sec and then reaches about 10% in 10 sec. The humidity increases at an almost constant pace afterwards. Loading and unloading of a wafer to/from the load-lock chamber 3 requires 10 to 30 sec in total, and a waiting time for transport and the like also need to be allowed for. This brings the humidity of the gas in the load-lock chamber 3 close to that in the clean room. When the temperature of gas with a humidity of 50% drops to about 12° C., the humidity reaches 100% to cause condensation.

Under the circumstances, in this embodiment, the storage port 10, load-lock chamber 3, and transport portion 7 in the clean room are accommodated in the internal space of the mini-environment 9. The mini-environment 9 isolates the internal space from the clean room and keeps the internal space clean. The mini-environment 9 also functions as a humidity control device which controls the humidity.

The mini-environment 9 has a machine chamber 92 enclosed with walls 91 and is isolated from the clean room. The mini-environment 9 is kept at a pressure more positive than the atmosphere around the mini-environment 9 so as to prevent any inflow of the atmosphere. The temperature in the mini-environment 9 is desirably set at the same temperature as that in the process chamber 1, and in this embodiment, it is set at 23° C. The mini-environment 9 has a filter 93 and air box 94.

As shown in FIG. 2, the filter 93 is arranged at the upper portion of the mini-environment 9. In this embodiment, the filter 93 can be formed by a combination of a ULPA filter and a chemical filter. The air box 94 is arranged above the filter 93.

Dehumidified air is supplied from an air supply system to the air box 94. The air box 94 pressurizes the air and supplies it to the filter 93 for purification. Air blown from the filter 93 is supplied to the machine chamber 92 as the internal space, thereby forming a downflow around the units in the machine chamber 92.

The air supply system collects air from the machine chamber 92 of the mini-environment 9 and then pressurizes and supplies it to the air box 94. The air supply system has a pipe 95, compressor 96, and dehumidifying unit 97. The pipe 95 is connected to both the air box 94 and the lower portion of the mini-environment 9. The compressor 96 is arranged midway along the pipe 95. The compressor 96 pressurizes air which has been dehumidified by the dehumidifying unit 97 and set to a predetermined temperature and supplies it to the air box 94. The mini-environment 9 is connected to the load-lock chamber 3 so as to communicate with the load-lock chamber 3. For this reason, when the gate valve 4 opens, the atmosphere in the mini-environment 9 which has been dehumidified by the dehumidifying unit 97 flows into the load-lock chamber 3, thereby forming a dehumidified environment in the load-lock chamber 3.

The dehumidifying unit 97 has a function of decreasing the humidity of sucked air and can adjust the humidity of the air to a predetermined humidity (e.g., about 10% or less, and preferably, about 5% or less). The dehumidifying unit 97 has a cooler 971, a heater 972, a mist filter 973, a hygrometer 974, and a controller 975 which controls these components.

Air sucked from the lower portion of the mini-environment 9 is supplied to the cooler 971 through the pipe 95 and cooled by the cooler 971. As a result, water vapor in the air saturates and condenses into water. For example, when air having a humidity of 50% at 23° C. is cooled to 12° C., the humidity becomes 100% to cause condensation. To decrease the humidity at 23° C. to 5% or less, the air needs to be cooled to −25° C. Accordingly, the air is cooled to −25° C., and 90% of the resulting water is removed and separated by the mist filter 973. The dehumidified and cooled air is heated by the heater 972 to a predetermined temperature (in this embodiment, 23° C.). Since the air at the predetermined temperature has been dehumidified, it has a low humidity (i.e., about 5% at 23° C.). The humidity can be adjusted to an arbitrary value by adjusting the cooling temperature of the cooler 971.

The mist filter 973 is arranged between the cooler 971 and the heater 972 to remove water generated by condensation. The type of the mist filter 973 according to the preferred embodiment of the present invention is not limited to a specific one, and any type of mist filter may generally be used as far as it can perform the above-mentioned operation. Preferably, the mist filter 973 is appropriately arranged to adjust the removal amount of water.

The hygrometer 974 measures the humidity in the mini-environment 9. The hygrometer 974 can employ any arrangement known in the art, and a description thereof will be omitted.

The controller 975 controls the cooling temperature (more specifically, the driving power for driving the cooler 971) of the cooler 971 and the heating temperature (more specifically, the driving power for driving the heater 972) of the heater 972 such that the hygrometer 974 indicates a predetermined temperature. Additionally, the controller 975 can control the flow velocity, pressure amount, and the like of the air. In this case, the controller 975 controls the flow velocity and pressure in the pipe 95.

The processing temperature of the process chamber 1 and the temperature of the heater 972 are generally set to the same temperature. In contrast to this, the process chamber 1 and mini-environment 9 have environments different in type of gas and pressure, and it is convenient for them to have independent temperature controllers to independently perform temperature adjustment.

Such an arrangement capable of independent temperature adjustment can easily support separate setting of the temperatures of the process chamber 1 and mini-environment 9.

The set temperature of the mini-environment 9 is not maintained by the mini-environment 9 itself. The set temperature of the mini-environment 9 is derived from the set temperature of the heater 972. Air temperature-adjusted by the heater 972 is supplied to the mini-environment 9, thereby maintaining the temperature in the mini-environment 9 at a predetermined value.

Therefore, it is convenient to determine the temperatures of the mini-environment 9 and heater 972 from the target value of the temperature of a wafer, that is, in this embodiment, a predetermined temperature of the process unit.

In this embodiment, the hygrometer 974 measures the humidity in the mini-environment 9. However, for example, the following operation may be performed. More specifically, the hygrometer 974 may measure the humidity in the load-lock chamber 3 after closing the gate valves 4 and 5 and immediately before evacuation. A second dehumidifying unit similar to the dehumidifying unit 97 for the mini-environment 9 may be provided in the load-lock chamber 3. In this case, the dehumidifying units is each arranged to operate independently.

When the humidity in an atmosphere decreases, static electricity is likely to occur. For this reason, the humidity is generally set to a value as high as about 50% in a clean room. The mini-environment 9 of this embodiment is dehumidified to have a low humidity, which is a characteristic feature of the present invention, and static electricity may occur. Since this embodiment has an ionizer 98 serving as a static eliminator, static electricity does not have any special effect.

One or a plurality of ionizers 98 are provided in the machine chamber 92 to generate ions to neutralize static electricity. Any technique known in the art can be applied to the ionizer 98. As the ionizer 98, by way of example, a corona discharge type ionizer can be used. In this case, generated air ions need to be carried in the air flow to a static elimination target. If the ionizer 98 is arranged above a unit (i.e., above the machine chamber 92) having a driving unit which generates static electricity, ions are carried by the downflow of the mini-environment 9, and no air blowing unit is necessary. In another embodiment, as an ionizer 98, a static eliminator using soft X-rays may be adopted. The static eliminator irradiates the vicinity of a static elimination target with soft X-rays to directly ionize air, and no special equipment for obtaining a static elimination effect is necessary. Ions immediately reach the static elimination target, and a static elimination time is short.

In still another embodiment, a dehumidifying unit 97 may use a dry dehumidifier having a dehumidifying portion, temperature adjustment unit, and process unit instead of the cooler 971, heater 972, and mist filter 973. Air sucked from the lower portion of a mini-environment 9 comes into contact with the dehumidifying member of the dehumidifying portion. As the dehumidifying member, silica gel, its composite, or the like can be used. Moisture in air is adsorbed by the dehumidifying member upon contact, and the air is dehumidified. After the temperature adjusting unit sets the temperature of the dehumidified air to a predetermined temperature, the air is supplied to an air box 94. The temperature adjusting unit comprises a heater, cooler, temperature measurement unit, and controller. The controller cools or heats the air on the basis of an output from the temperature adjusting unit to adjust the temperature to a predetermined temperature. The dehumidifying member which has adsorbed moisture from the air moves to the process unit. The process unit blows the heated air to the dehumidifying member. The moisture of the dehumidifying member is desorbed by the heated air. That is, the dehumidifying member loses moisture and is dried. After that, the dehumidifying member moves again to the dehumidifying portion, comes into contact with air, and dehumidifies it. This operation is continuously performed, and dehumidified air is stably supplied to the mini-environment 9.

In still another embodiment, a dehumidifying unit 97 may utilize an electrolytic dehumidifier instead of the cooler 971, heater 972, and mist filter 973. The electrolytic dehumidifier has an arrangement in which porous electrodes are arranged at both ends of a solid polyelectrolyte film and includes a temperature adjusting unit. The anode performs dehumidification, faces the interior of a pipe 95, and comes into contact with air to be dehumidified. The cathode releases moisture, faces the outer air, and comes into contact with the air in a clean room. Air sucked from the lower portion of a mini-environment 9 comes into contact with the anode of the solid polyelectrolyte film. At this time, when a DC voltage is applied to the porous electrode, the moisture in the air which has come into contact with the electrolyte film undergoes electrolysis to be separated into hydrogen ions and oxygen. The hydrogen ions move to the cathode side. At the cathode, the hydrogen ions react with oxygen in the air, returns to moisture, and are released to the outer air. The air which has come into contact with the electrolyte film, loses moisture by electrolysis, and been dehumidified is temperature-adjusted to a predetermined temperature by the temperature adjusting unit and then is pressurized and supplied to an air box 94 of the mini-environment 9. The temperature adjusting unit comprises a heater, cooler, temperature measurement unit, and controller. The controller heats or cools the air on the basis of an output from the temperature measurement unit and adjusts the temperature to a predetermined temperature. With this operation, the dehumidified air is supplied to the mini-environment 9.

In still another embodiment, a dehumidifying unit 97 may utilize a dehumidifier which uses a lithium chloride solution instead of the cooler 971, heater 972, and mist filter 973. When air to be dehumidified is blown into the lithium chloride solution, and made to pass through the solution, the moisture in the air dissolves in the lithium chloride solution, and the air is dehumidified. Since the moisture in the lithium chloride solution increases during the dehumidification operation, the concentration of the lithium chloride solution decrease. The lithium chloride solution is introduced to the heater, and heated, thereby releasing the moisture to the air. With this operation, the lithium chloride solution loses moisture and has a higher concentration. The lithium chloride solution returns to the dehumidifying unit to dehumidify the air.

Substrate transport operation as an exposure processing system using one of the above-mentioned load-lock systems will be described. A transport portion 7 takes one or a plurality of substrates from a carrier 102 placed on a substrate carrier table 101. The transport portion 7 holding the substrate or substrates contracts its arm and checks the state of the atmosphere in a load-lock chamber 3. At this time, the internal space of a mini-environment 9 is filled with air having a humidity of 5% at a temperature of 23° C. and the atmospheric pressure by a dehumidifying unit 97. At least a storage port 10 and the transport portion 7 are kept in this atmosphere.

The transport portion 7 turns the arm toward the load-lock chamber 3 and confirms that the gate valve 4 is open. The transport portion 7 stretches the arm, transports a substrate into the load-lock chamber 3, and places on three pins of a substrate holding chuck 6. Opening the gate valve 4 causes the atmosphere in the load-lock chamber 3 and that in the mini-environment 9 to communicate with each other. If a hygrometer 974 detects the humidity in the mini-environment 9 is higher than a predetermined value (in this embodiment, 5%), a controller 975 controls the units of the dehumidifying unit 97 to set the humidity in the mini-environment 9 to a predetermined value. As a result, the atmosphere in the load-lock chamber 3 is filled with air having a humidity of 5% at a temperature of 23° C.

The substrate is loaded to the load-lock chamber 3 and is placed on the substrate holding chuck 6. When the transport portion 7 retracts its arm, the gate valve closes. Then, the load-lock chamber 3 is purged with an atmosphere.

To purge the load-lock chamber 3 with an atmosphere, the gate valves 4 and 5 are closed, and the atmosphere in the load-lock chamber 3 is isolated. Then, the valve 122 closes, and the load-lock chamber 3 is evacuated through an exhaust pipe 121 by a vacuum exhaust pump (not shown). When the pressure in the load-lock chamber 3 after the evacuation reaches a predetermined value, the valve 122 is closed, and the evacuation ends. During the evacuation, the air in the load-lock chamber 3 is cooled by adiabatic expansion.

In this embodiment, a reduction in temperature is calculated from the gas exhaust time and the volume of the load-lock chamber 3. The humidity is determined to be about 5% so as to prevent condensation at the reduced temperature. A reduction in temperature is easily obtained by an experiment, but can be obtained by a simulation. In the present invention, however, a method of calculating a reduction in temperature is not limited to a specific one. Any method may be employed as far as it can estimate a reduction in temperature at a virtually satisfactory precision. The setting of gas exhaust and temperature conditions in the present invention are not limited to the above-mentioned method. Any humidity may be determined to determine other conditions. The humidity in the load-lock chamber is preferably 10% or less, more preferably 5% or less. For example, if a predetermined humidity is set at 10%, the air with this humidity generates dew drops at 20° C. For this reason, the load-lock chamber 3 is preferably evacuated so as to prevent the lowest temperature from decreasing below −20° C. This can prevent condensation. If the load-lock chamber 3 has volume of 8 liters, evacuation is preferably performed for 26 sec. In this case, even if the temperature drops, it does not decrease below −20° C., and no condensation occurs. By applying this idea, a gas exhaust time condition can be calculated from the humidity.

These ideas can be reflected in the design stage. More specifically, a required value for the gas exhaust time is obtained from the throughput of a process station, and the humidity is set to an appropriate value. The allowable volume (liters) of the load-lock chamber 3 is determined from the two determined conditions. By designing the load-lock chamber 3 on the basis of the volume, the idea of the present invention can be reflected in the design process.

Then, a valve 132 opens. Valves 132 and 134 for supplying He gas and $N_2$ gas are separately provided in the load-lock chamber 3. Only the valve 132, which is a valve for supplying gas identical to the atmosphere in the process chamber 1 opens. He gas is supplied until the pressured in the load-lock chamber 3 become equal to that in the process chamber 1. When the pressure gauge 31 detects that the pressure in the load-lock chamber 3 becomes equal to that in the process chamber 1, the valve 132 closes, and He gas supply stops.

When the valve 132 closes, and He gas supply stops, the gate valve 5 opens. A substrate to be processed is taken from the load-lock chamber 3 by a transport portion 8 in a preliminary space 2 and is transported to a process station (not shown). The substrate processed in the process station is returned via the load-lock chamber 3 to the carrier 102 by the transport portions 7 and 8.

As described above, in this embodiment, the humidity of gas exhausted from the load-lock chamber 3 is set to a predetermined value or less so as to prevent condensation of water vapor. To implement this, the transport portion 7 which is arranged in the outer air and includes the load-lock chamber 3 is accommodated in the mini-environment 9 which isolates from a clean room.

In still another embodiment, only a load-lock chamber 3 may have a dehumidifying function. These embodiments may include, e.g., one wherein air components having different humidities are supplied to a mini-environment 9 and the load-lock chamber 3. Air whose temperature and particles are controlled is supplied to the mini-environment 9. This air need not undergo humidity control.

Figure 5:
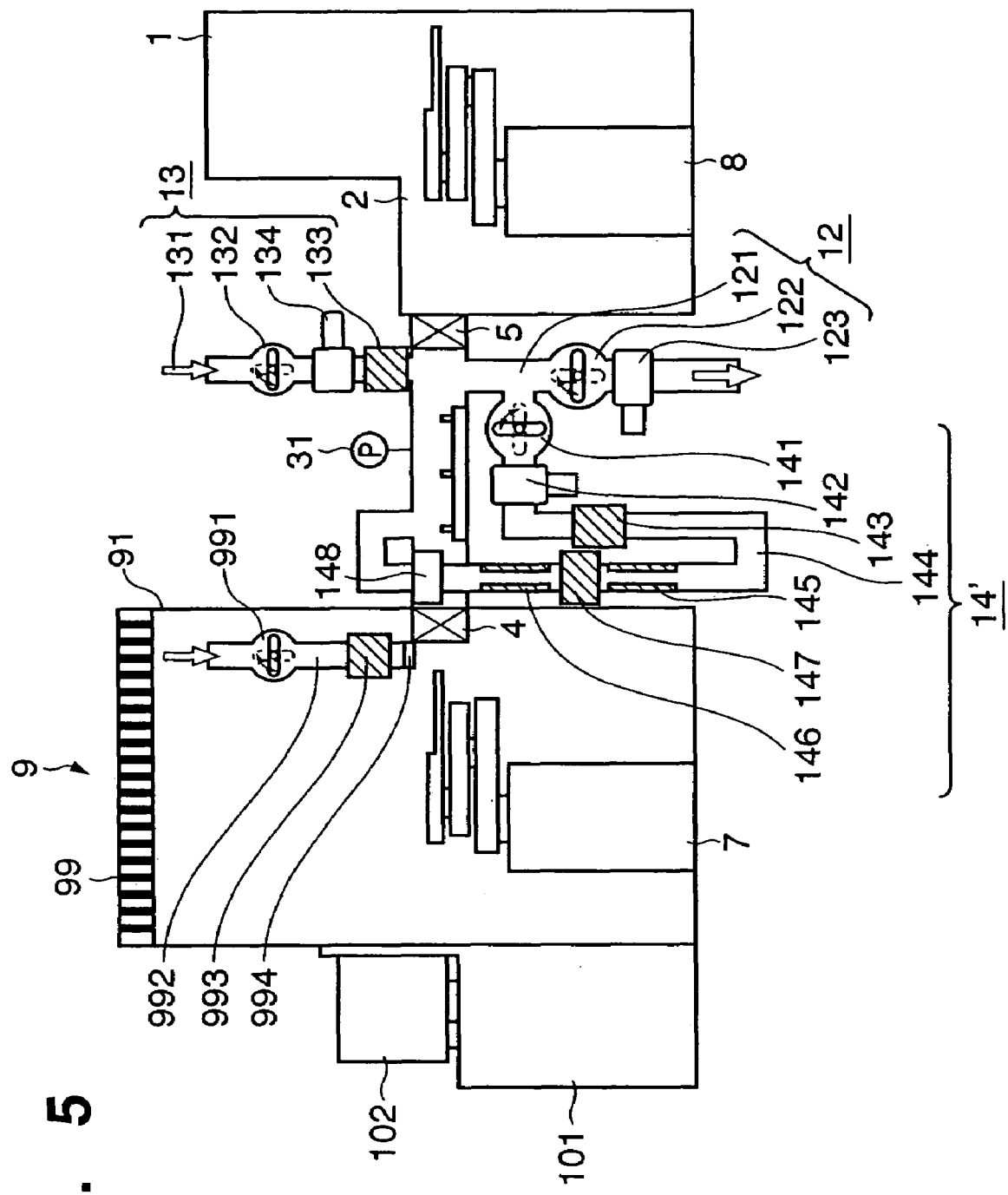
FIG. 5 is a schematic block diagram of an embodiment of load-lock system having a function of dehumidifying.

FIG. 5 is a block diagram of the embodiment in which only load-lock chamber 3 has a dehumidifying function.

In this embodiment, a dehumidifying unit 14' is connected to the load-lock chamber 3. The dehumidifying unit 14' comprises a collection unit which collects gas from the load-lock chamber 3, a dehumidifier which dehumidifying the collected gas, and a supply unit which supplies the dehumidified gas to the load-lock.

The collection unit comprises a valve 141, a flowmeter 142 which measures the flow rate of gas, and a filter 143 which removes particle mists from collected gas. The dehumidifier comprises a cooler 145 which cools gas to condense water vapor, a mist filter 147 removes condensed water vapor, and a heater 146 which heats dehumidified low-temperature gas to adjust the temperature of the gas to a predetermined temperature of the load-lock chamber. The supply unit comprises a compressor 148 which pressurizes the dehumidified and temperature-adjusted gas to eject to the load-lock.

If particles are emitted from the compressor 148 to the gas, a filter may be provided on the subsequent stage of the compressor. Gas may be supplied to the load-lock chamber 3 after removing the particles from the gas. In this embodiment, this filter is not shown.

Operation of this embodiment will be described next. The pressure in the load-lock chamber 3 becomes the atmospheric pressure, and the gate valve 4 opens to the mini-environment 9. The collection valve 141 opens, and gas collection starts in the load-lock chamber 3. Since collected gas may be exhausted together with particles present in the load-lock chamber 3, the particles and mists are removed by the filter 143.

The gas from which particles and mists have been removed and which has been purified is introduced via the pipe 144 to the dehumidifying unit. In the dehumidifying unit, the gas is fed to the cooler 145 and is cooled. Consequently, water vapor in the gas saturates, and condenses to generate moisture. The relationship between the cooling temperature and the humidity is the same as in the above-mentioned case wherein dehumidification is performed for each mini-environment, and a description thereof is omitted. To keep the temperature and humidity in the load-lock chamber at 23° C. and 5% or less, respectively, the gas is cooled to −25° C. or less. Dew drops generated due to cooling to −25° C. or less are removed and separated by the mist filter 147. The dehumidified and cooled gas is heated to a predetermined temperature (in this embodiment, 23° C., as described above) by the heater 146. The gas which has the predetermined temperature is free from moisture and has a low humidity (i.e., about 5% at 23° C). The type of mist filter can appropriately be changed, as described in the first embodiment.

The humidity of the dehumidified gas is measured by a hygrometer (not shown). The dehumidified and temperature-adjusted gas is appropriately pressurized by the compressor 148 and supplied to the load-lock chamber 3.

As described above, a low humidity is likely to cause static electricity. If static electricity is generated, a substrate to be processed may electrically be charged. This may cause damage to a semiconductor circuit during the manufacture or may attract ambient particles and pose a problem due to attracted particles. However, in this embodiment, only the load-lock chamber 3 is dehumidified, and the load-lock chamber 3 incorporates no movable portion. The static electricity is often generated by movement of an object, contact between objects, and separation between objects. Since the load-lock chamber 3 incorporates no movable portion, no static electricity is generated in the load-lock chamber 3. Therefore, an ionizer is not essential in the load-lock chamber 3.

In this embodiment, the load-lock chamber 3 is dehumidified, it is not essential to dehumidify the mini-environment 9. For this reason, for structural simplicity, the mini-environment 9 takes the form of a general clean booth. More specifically, the mini-environment 9 has an FFU 99 at its upper portion, and no dehumidifying unit including a gas collection unit is provided. The FFU 99 draws the air from outside, removes particles by an internal filter, and purifies the air. The FFU 99 ejects the air to a machine chamber 92 to form a downflow. A slit or opening is formed in the lower portion of a wall 91 of the mini-environment 9. The gas as the downflow is emitted from the opening to outside the mini-environment 9. Since a pressurized downflow is flowing in the mini-environment 9, the mini-environment 9 is at a pressure more positive than that outside. Outer gas containing particles does not flow from the opening. Accordingly, the opening does not affect the clean environment in the mini-environment 9.

If the mini-environment 9 is set in a clean room, the temperature of gas is adjusted to a predetermined temperature of the clean room, and mini-environment 9 need not adjust the temperature. This is because gas at a predetermined temperature of 23° C. is supplied to the load-lock chamber 3 regardless of the temperature in the mini-environment 9, and it is not essential to adjust the temperature in the mini-environment 9 to the predetermined temperature of the load-lock chamber 3. In some cases, the temperature in the mini-environment 9 is limited by another requirement, that is, the temperature of a substrate to be processed in transport. In this case, if the temperature in the clean room and the predetermined temperature of the substrate to be processed are different from each other, a temperature-adjusting unit may be provided in a gas supply system of the mini-environment 9 to adjust the temperature of the gas.

In the mini-environment 9 described in this embodiment, the humidity is the same as that in the clean room, and is generally set to a high humidity, e.g., 50%. For this reason, even if a unit which drives a transport robot or the like is present, static electricity is unlikely to occur, and it is not essential to eliminate any static electricity.

Figure 6:
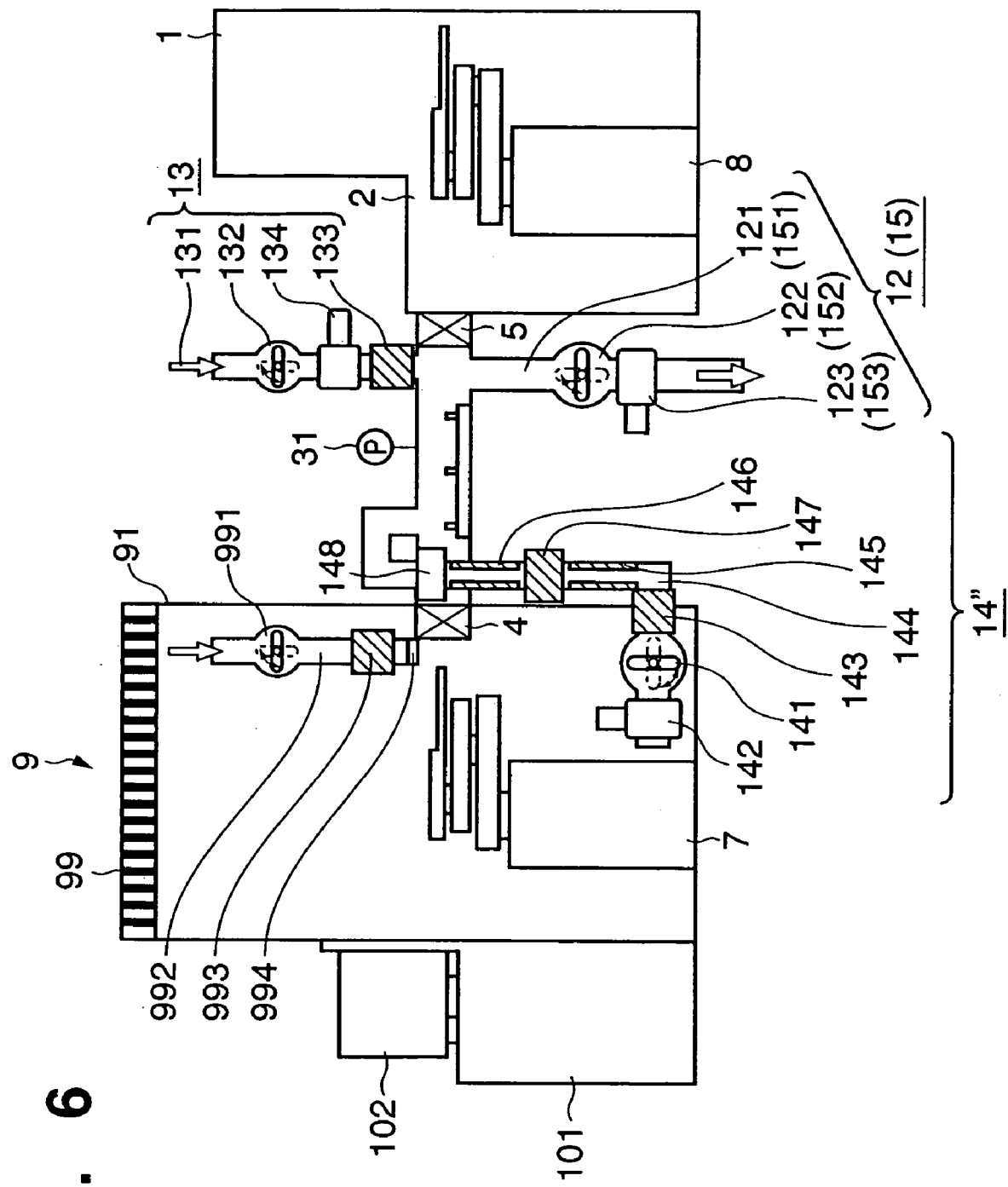
FIG. 6 is a schematic block diagram of an embodiment of drawing gas from a mini-environment.

In still another embodiment, a gas introduction unit of the dehumidifying unit arranged in a load-lock chamber 3 may introduce gas from a mini-environment 9 or the clean room instead of collecting gas from the load-lock chamber 3. FIG. 6 is a block diagram of such an embodiment.

In this embodiment, for example, a case will be described wherein a dehumidifying unit 14″ is connected to the mini-environment 9. Schematically, the dehumidifying unit 14″ has an arrangement similar to that of the dehumidifying unit 14, but is different in that a valve 141 and the like are arranged in the mini-environment 9. The valve 141 for drawing gas from the mini-environment 9 is formed in the mini-environment 9 and draws gas from the mini-environment 9. Particles are removed from the drawn gas by a filter 143, and the clean gas is fed to a cooler 145. Operation in which the gas is supplied from the cooler 145, pressurized by a compressor 148 and supplied to the load-lock chamber 3 is the same as described above.

An exhaust portion 15 is provided in the load-lock chamber 3. As shown in FIG. 6, a pipe 121 of an exhaust portion 12 for purging the load-lock chamber 3 with an atmosphere may also serve as an opening of the exhaust portion 15 to the load-lock chamber 3.

An exhaust valve 151 of the exhaust portion 15 is normally closed. When dehumidified gas is pressurized and supplied to the load-lock chamber 3, the exhaust valve opens and exhausts the gas in the load-lock chamber 3 corresponding to the supplied gas. At this time, the load-lock chamber 3 is at a pressure more positive than that of the outside due to the conductance of the valve 151. A gas flow through the exhaust valve 151 and the positive pressure prevent outer particles or the like from entering the load-lock chamber 3 from the exhaust valve 151. The positive pressure value depends on the conductance of the exhaust valve 151 and the supply amount of dehumidified gas. Keeping the pressure in the load-lock chamber 3 to a pressure slightly more positive than that in the mini-environment 9 prevents the undehumidified gas in the mini-environment 9 from entering the load-lock chamber 3 from the opening in the load-lock chamber 3.

In still another embodiment, $N_2$ gas or the like may be employed as a dehumidified gas to be supplied to a load-lock chamber 3. In this case, the whole arrangement is the same as described above except that a gas introduction unit is different. If a gas atmosphere in the load-lock chamber 3 is formed from gas other than the air, this embodiment is preferable.

A gas supply unit different from a gas ejection port of a mini-environment 9 may be provided at the upper portion of the load-lock chamber 3, separately from a gas supply unit which supplies dehumidified gas to the load-lock chamber 3. The gas supply unit comprises a gas source (not shown), a flow control valve 991, a filter 993 which removes particles, a nozzle 994 which ejects a gas shower, and a pipe 992 which connects the gas source to the nozzle 994.

The eject nozzle 994 of the gas supply unit is a showerhead-like member having a plurality of openings or a member having a fine gas path such as a sintered filter obtained by sintering particles. The gas supplied from the gas source is ejected from the nozzle 994 like a shower of air. At this time, the nozzle 994 can operate efficiently when arranged immediately above the opening of the load-lock chamber 3. The gas ejected from the nozzle 994 functions as an air curtain, and prevents the gas in the load-lock chamber 3 and the air in the clean booth 9 from mixing with each other. This can suppress a rise in temperature of the gas in the load-lock chamber 3. Since the particles are removed from the gas to be ejected, even when a wafer is loaded/unloaded to/from the load-lock chamber 3 across the flow of the gas, no particle attaches to the wafer.

The gas source (not shown) is provided separately from a supply system which supplies air to the mini-environment 9. The gas supply unit may be different from an air supply system which supplies dehumidified air to the load-lock chamber 3. Since the humidity in the load-lock chamber 3 needs to be maintained, gas which is dehumidified to have a humidity of 5% that is equal to that of gas supplied to the load-lock chamber 3 needs to be supplied.

The flow rate and flow velocity of air to be ejected needs to be sufficiently high to prevent the air in the load-lock chamber 3 and that in the mini-environment 9 from mixing with each other. The same effect can be obtained with a less amount of air than a case wherein dry air having a predetermined humidity is supplied to the whole mini-environment 9, and the whole mini-environment 9 is kept at a predetermined humidity.

Figure 3:
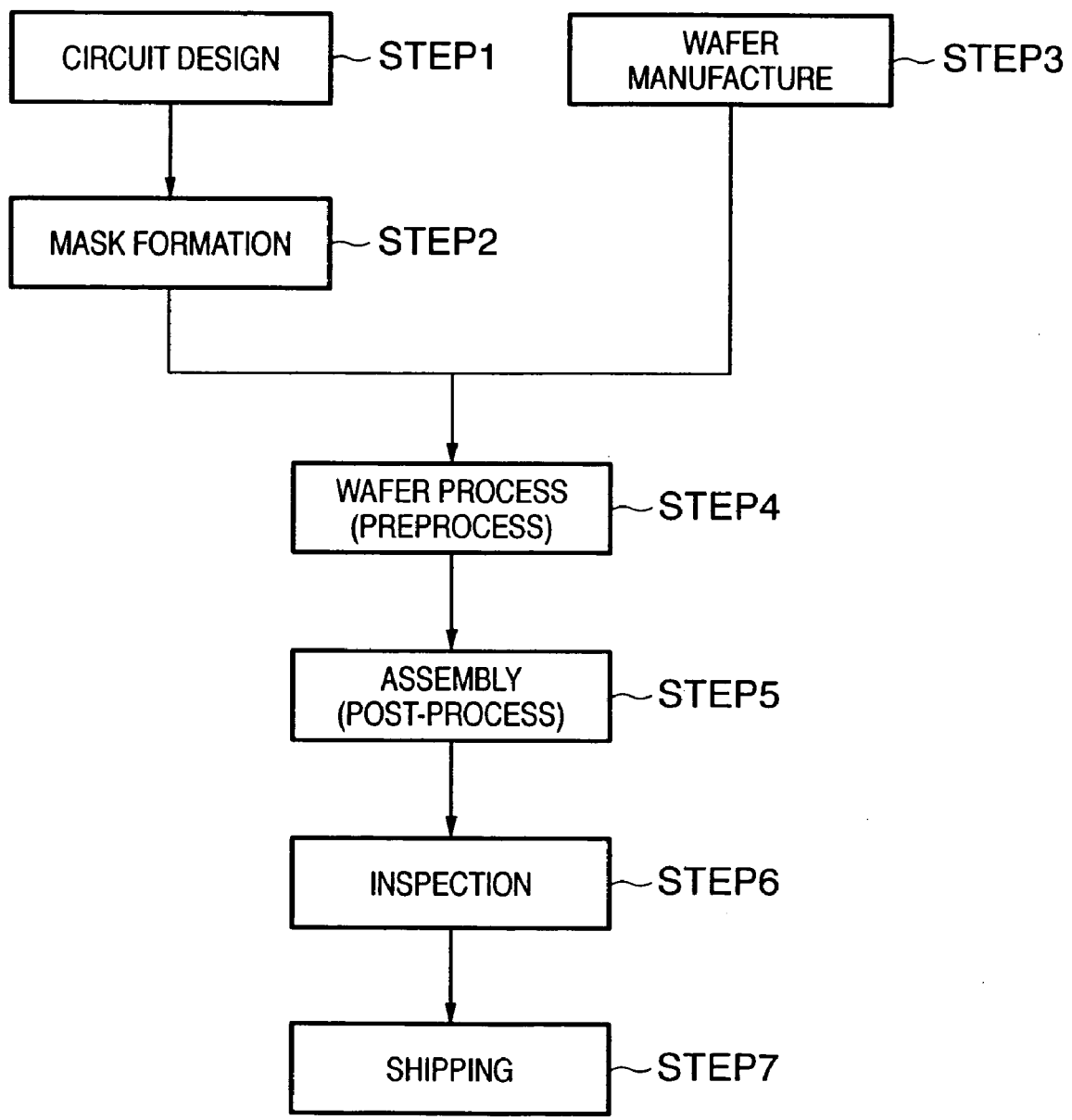
FIG. 3 is a flow chart for explaining the manufacturing process of a device (semiconductor chip on which, for example, an IC or LSI is formed, LCD, CCD, or the like)

A device manufacturing method using the above-mentioned load-lock system will be described with reference to FIGS. 3 and 4. FIG. 3 is a flow chart for explaining the manufacture of a device (semiconductor chip such as an IC or LSI, LCD, CCD, or the like). In this embodiment, the manufacture of a semiconductor chip will be exemplified. In step 1 (circuit design), a device circuit is designed. In step 2 (mask formation), a mask having the designed circuit pattern is formed. In step 3 (wafer manufacture), a wafer is manufactured by using a material such as silicon. In step 4 (wafer process) called a preprocess, an actual circuit is formed on the wafer by lithography using the prepared mask and wafer. Step 5 (assembly) called a post-process is the step of forming a semiconductor chip by using the wafer formed in step 4, and includes an assembly process (dicing and bonding) and packaging process (chip encapsulation). In step 6 (inspection), the semiconductor device manufactured in step 5 undergoes inspections such as an operation confirmation test and durability test of the semiconductor device manufactured in step 5. After these steps, the semiconductor device is completed and shipped (step 7).

Figure 4:
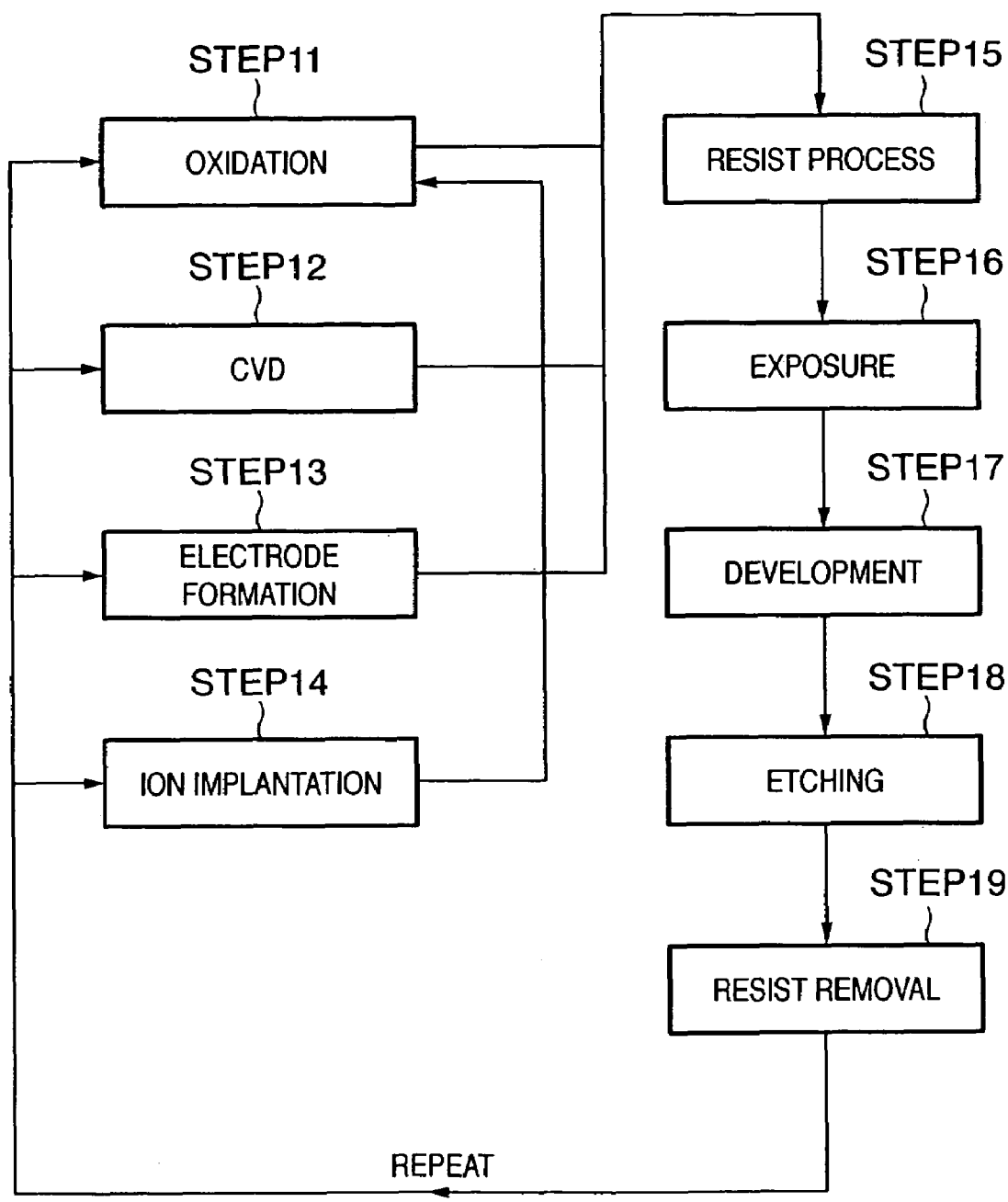
FIG. 4 is a flow chart showing the detailed flow of the wafer process in step 3 shown in FIG. 3.

FIG. 4 shows the detailed flow of the wafer process in step 4. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the circuit pattern is transferred onto the wafer using the above-mentioned exposure apparatuses. In step 17 (development), the exposed wafer is developed. In step 18 (etching), the resist is etched except for the developed resist image. In step 19 (resist removal), an unnecessary resist after etching is removed. These steps are repeated to form multiple circuit patterns on the wafer. According to the device manufacturing method of this embodiment, a device having a higher quality than a conventional one can be manufactured. A device manufacturing method which uses a load-lock chamber, load-lock system, and exposure processing system according to the present invention, or a resulting device constitute an aspect of the present invention.

As described above, according to a preferred embodiment of the present invention, in a load-lock system which transports a substrate through a load-lock chamber, a problem that fine particles or chemical components agglomerate around condensed moisture to attach to a wafer does not occur in purging of the atmosphere in the load-lock chamber.

As described above, according to the present invention, a load-lock system which can implement high-quality processing while ensuring a predetermined throughput, an exposure processing system, and a device manufacturing method can be provided.

As many apparently widely different embodiments of the present invention can be made without departing from the spirit and scope thereof, it is to be understood that the invention is not limited to the specific embodiments thereof except as defined in the appended claims.

What is claimed is:

1. A load-lock system comprising:
    a load-lock chamber arranaed between a storage port which stores a substrate and a process chamber which processes the substrate in a process space maintained at a pressure lower than a pressure in the outside;
    a dehumidifying unit which supplies dehumidified gas into said load-lock chamber; and
    an exhaust unit which exhausts a gas in said load-lock chamber,
    wherein said dehumidifying unit forms a dehumidified atmosphere in said load-lock chamber by supplying said dehumidified gas into said load-lock chamber before said exhaust unit exhausts the gas in said load-lock chamber.

2. A system according to claim 1, wherein said dehumidifying unit has a controller which controls a humidity in said load-lock chamber so as to prevent moisture in said load-lock chamber from condensing when a temperature in said load-lock chamber drops.

3. A system according to claim 1, wherein said dehumidifying unit has a pipe which communicates with said load-lock chamber, a cooler and a heater placed in the pipe, and a controller separately controls the cooler and heater.

4. A system according to claim 1, wherein said dehumidifying unit has a filter for removing moisture, the filter being arranged between the cooler and the heater in the pipe.

5. A load-lock system comprising:
    a load-lock chamber arranged between a storage port which stores a substrate and a process chamber which processes the substrate in a process space maintained at a pressure lower than a pressure in the outside;
    a machine chamber arranaed between said storage port and said load-lock chamber;
    a dehumidifying unit which supplies dehumidified gas into said machine chamber; and
    an exhaust unit which exhausts a gas in said load-lock chamber,
    wherein said dehumidifying unit forms a dehumidified atmosphere in said load-lock chamber by supplying said dehumidified gas into said load-lock chamber before said exhaust unit exhausts the gas in said load-lock chamber.

6. A system according to claim 5, wherein said dehumidifying unit has a controller which controls a humidity in said machine chamber so as to prevent moisture in said load-lock chamber from condensing when a temperature in said load-lock chamber drops.

7. A system according to claim 6, wherein the controller calculates a humidity in said load-lock chamber and the humidity in said machine chamber, and said dehumidifying unit controls the humidity in said machine chamber so as to prevent moisture in gas flowing from said machine chamber into said load-lock chamber from condensing when the temperature in said load-lock chamber drops, on the basis of a calculation result by the controller.

8. A system according to claim 5, wherein said dehumidifying unit has a pipe which communicates with said machine chamber, a cooler and a heater placed in the pipe, and a controller separately controls the cooler and heater.

9. A system according to claim 5, further comprising a static eliminator which eliminates static electricity in said machine chamber.

10. A system according to claim 5, wherein said machine chamber includes a transport portion which transports the substrate between said storage port and said load-lock chamber.

11. An exposure processing system comprising:
a storage port which stores a substrate;
an exposure processing unit which exposures the substrate in a process space maintained at a pressure lower than a pressure in the outside;
a load-lock chamber arranged between said storage port and said exposure processing unit;
a dehumidifying unit which supplies dehumidified gas into said load-lock chamber; and
an exhaust unit which exhausts a gas in said load-lock chamber,
wherein said dehumidifying unit forms a dehumidified atmosphere in said load-lock chamber by supplying said dehumidified gas into said load-lock chamber before said exhaust unit exhausts the gas in said load-lock chamber.

12. An exposure processing system comprising:
a storage port which stores a substrate;
an exposure processing unit which exposures the substrate in a process space maintained at a pressure lover than a pressure in the outside;
a load-lock chamber arranged between said storage port and said exposure processing unit;
a mini-environment arranged between said storage port and said load-lock chamber;
a dehumidifying unit which supplies dehumidified gas into said mini-environment; and
an exhaust unit which exhausts a gas in said load-lock chamber,
wherein said dehumidifying in a unit forms a dehumidified atmosphere in said load-lock chamber by said dehumidified gas into said load-lock chamber before said exhaust unit exhausts the gas in said load-lock chamber.

13. A device manufacturing method comprising:
an exposure step of exposing a substrate using an exposure processing system as defined in claim 11; and
a development step of developing the exposed substrate.

14. A device manufacturing method comprising:
an exposure step of exposing a substrate using an exposure processing system as defined in claim 12; and a development step of developing the exposed substrate.

* * * * *

UNITED STATES PATENT AND TRADEMARK OFFICE
CERTIFICATE OF CORRECTION

| | | |
|---|---|---|
| PATENT NO. | : 7,276,097 B2 | Page 1 of 1 |
| APPLICATION NO. | : 10/809021 | |
| DATED | : October 2, 2007 | |
| INVENTOR(S) | : Ryo Edo | |

It is certified that error appears in the above-identified patent and that said Letters Patent is hereby corrected as shown below:

Col. 14, line 30 claim 1 delete "chamber arranaed between" and insert therefore -- chamber arranged between --

Col. 14, line 60 claim 1 delete "chamber arranaed between" and insert therefore -- chamber arranged between --

Col. 16, line 21 claim 12 delete "dehumidifying in a unit" and insert therefore -- dehumidifying unit --

Col. 16, line 22 claim 12 delete "chamber by said" and insert therefore -- chamber by supplying said --

Signed and Sealed this

Fourth Day of December, 2007

JON W. DUDAS
*Director of the United States Patent and Trademark Office*